United States Patent [19]

Gloden et al.

[11] Patent Number: 5,545,984
[45] Date of Patent: Aug. 13, 1996

[54] DAMPING DEVICE FOR SONIC WAVEGUIDES

[75] Inventors: Michael L. Gloden, Apex; Arnold F. Sprecher, Jr., Raleigh, both of N.C.

[73] Assignee: MTS Systems Corporation, Eden Prairie, Minn.

[21] Appl. No.: 439,506

[22] Filed: May 11, 1995

[51] Int. Cl.$^6$ .............. G01B 7/14; G01F 23/30; H03H 9/22; H04B 11/00

[52] U.S. Cl. .............. 324/207.13; 73/314; 324/207.24; 333/148

[58] Field of Search .............. 324/207.13, 207.22, 324/207.24; 333/148; 73/314; 181/207, 208

[56] References Cited

U.S. PATENT DOCUMENTS

| | | |
|---|---|---|
| 3,898,555 | 8/1975 | Tellerman .............. 324/207.13 |
| 4,860,851 | 8/1989 | Krevor et al. . |
| 4,952,873 | 8/1990 | Tellerman .............. 324/207.13 |
| 4,958,332 | 9/1990 | Tellerman .............. 324/207.13 X |
| 5,076,100 | 12/1991 | Hunter et al. .............. 324/207.13 X |

*Primary Examiner*—Gerard R. Strecker
*Attorney, Agent, or Firm*—David M. Ostfeld

[57] ABSTRACT

A damping element for use with a waveguide that supports a current pulse and results in a torsional or longitudinal strain wave is disclosed. The damping element is to dampen the reflection of the strain wave and includes a sleeve surrounding the waveguide and a mechanism for applying pressure on the sleeve so the sleeve exerts pressure on the waveguide, thereby gradually dampening the strain wave energy along the length of the waveguide surrounded by the damping element sleeve to prevent reflection of the strain wave.

23 Claims, 2 Drawing Sheets

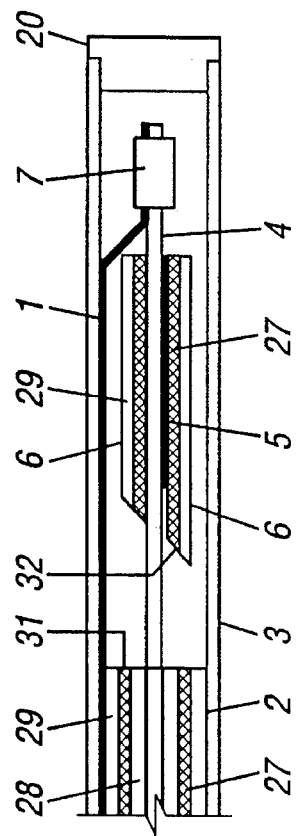
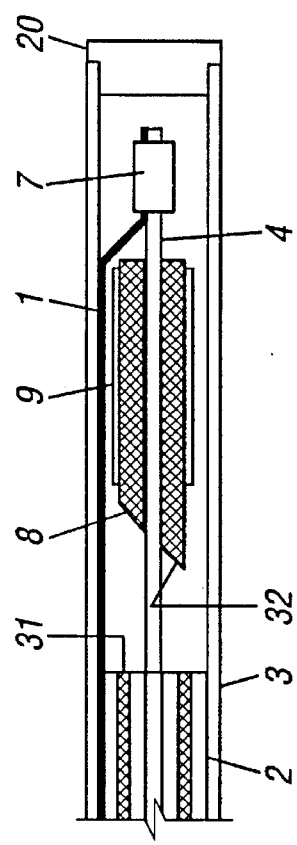
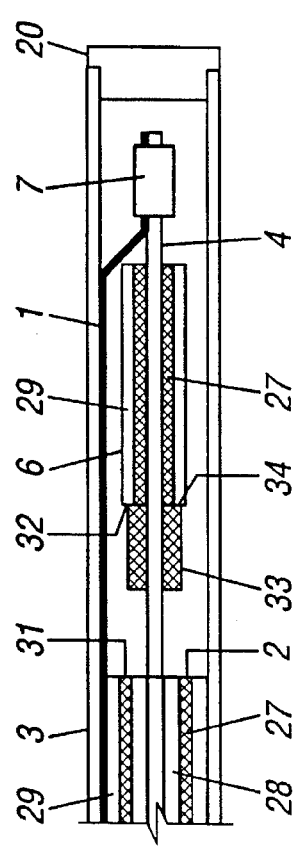
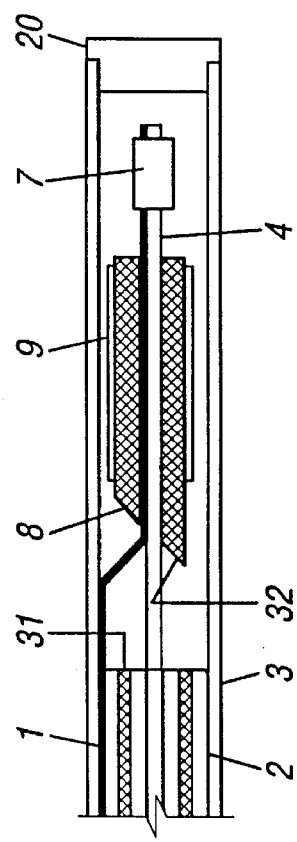

DAMPING DEVICE FOR SONIC WAVEGUIDES

BACKGROUND OF THE INVENTION

1. Field of the Invention

The present invention relates to damping devices for elongated waveguides in magnetostrictive displacement or distance measuring transducers, and more particularly to modularly constructed magnetostrictive -transducers having damping, including for displacement or distance measuring.

2. Description of the Art

Magnetostrictive transducers having elongated waveguides that carry torsional strain waves induced in the waveguide when current pulses are applied along the waveguide through a magnetic field are well known in the art. A typical linear distance measuring device using a movable magnet that interacts with the waveguide when current pulses are provided along the waveguide is shown in U.S. Pat. No. 3,898,555. Damping devices for waveguide are illustrated in this patent, to prevent reflected sonic strain waves at both the remote end of the waveguide and the mounted end of the waveguide. These devices generally are soft rubber pads that are clamped about the waveguide to absorb sonic strain wave pulse energy to minimize reflections of the generated pulse and reduce interference of the reflections with the signals to be sensed.

The damping devices and the arrangement for anchoring the waveguide at a remote end may take up a substantial length at the end remote from the signal source of a sonic waveguide for prior art of this sort, as discussed in U.S. Pat. No. 3,898,555. Where liquid levels, for example, are being sensed by the transducers, it is desirable to have the waveguide operable and active as close to the bottom of the tank as possible, thereby minimizing the length of the waveguide support at its remote end from the signal source, including the length of the separate clamping device at such end, and at the mounted end of the waveguide, where the signal source is mounted.

It is also known in the art to use silicone rubber dampers of two different durometers and/or different loading pressure against the waveguide. Lower pressure and lower durometer silicone rubber has been utilized to minimize front end reflection (input end) while higher durometer silicone rubber in conjunction with greater clamping pressures has been utilized to provide damping at the remote or termination end. This use of silicone rubber was believed to be a compromise as a damping medium because of its high resilience, which leads to the need for long damping sections. Silicone rubber does have good stability over a wide temperature range which is an important benefit for damping materials.

In addition, in the prior art, the mass density of the damping material may be quite important to provide a mechanical impedance such that the sonic strain wave energy can be transferred into the damping device and dissipated. The coupling of the waveguide to the damping device must also be effective. The dissipation of the sonic strain wave energy by the damping medium has been thought in the prior art to provide the damping.

It is also known in the art to use gum type damping media because of the ability to attenuate or damp vibration but such materials harden at temperatures which are near the freezing point of water and become extremely soft at temperatures well below 200 degrees Fahrenheit. The same is true for epoxy or urethane elastomers, and such large changes in characteristics change the "front" end reflection and the "extreme" end reflection characteristics drastically with temperature.

The need for an effective damp material is especially evident when the transducer uses what is known as recirculation mode sensing. In the recirculation mode, each time the sensor receives a sonic strain wave signal, a new current pulse is sent, and this leads to a high frequency of sonic strain wave pulses and a build up of noise as a result of reflections. If effective damping is not provided, "noise" build-up reduces the usefulness of the sensing technique, especially since the sonic strain wave signal is known in the prior art to be of low amplitude. Thus, in the prior art, it was ideal for the damp material to be capable of being kept short, along with the end mounting structure for the waveguide, to have good coupling to the waveguide itself, and to have the ability to dissipate energy, the total of which is not well achieved in the prior art. For other approaches raising signal strength, see U.S. Pat. No. 4,952,873.

An alternate methodology for damping is set out in U.S. Pat. No. 4,958,332. This patent teaches an improved damping method. The damping device comprises a highly viscous, flowable material that adheres to and couples to the waveguide, and which can have mass density changing additions, such as metallic powder, to vary the mass density along its length. The damping material is held against the waveguide with a suitable housing which can be loaded against the waveguide with pressure as selected. While such a method is effective, it is difficult to produce.

Also in the prior art, two half pieces (flat sheets) of rubber have been used to enclose a waveguide with a metal clamp to retain them around the waveguide and apply pressure to the waveguide at the input side, but this is fairly expensive.

For general background information, see "Ultrasonic Level, Temperature and Density Sensor" by S. C. Rogers and G. N. Miller, IEEE Transactions on Nuclear Science, Vol. NS-29, No. 1, February 1982.

It is an object of the present invention to produce a waveguide damping mechanism which is easy to produce and assemble.

SUMMARY OF THE INVENTION

The present invention relates to a remote end structure for an elongated member, such as a waveguide used with a magnetostrictive displacement or distance measuring transducer, that adequately prevents reflected waves, such as torsional or longitudinal strain waves, and does not take up a substantial length at the remote end. Thus, for example, the waveguide is operable and active close to the end of the elongated member, while the remote end structure prevents reflection of sonic strain wave pulses that are transmitted along the waveguide.

The actual damping is achieved by a damping element slipped over the end of the waveguide. The damping element is a sleeve made of fibers of a fine, hard material, or combination of materials such as ceramic or metal or glass or polymer. The end facing the transducer head is cut at about a 45° angle in order to more properly match impedance with the elongated member, such as the waveguide.

DESCRIPTION OF THE DRAWINGS

For a further understanding of the nature and objects of the present invention, reference should be had to the following figures in which like parts are given like reference numerals:

FIG. 2a is a cross-sectional view of the sensing element assembly of the preferred embodiment of the present invention of FIG. 1 taken along section lines 2—2 of FIG. 1 showing a portion of the waveguide and surrounding sleeves showing the damping element at the end of the waveguide;

FIG. 2b is the same cross-sectional view of FIG. 2a, but showing a first alternative of using a tuning wire between the damping element and the waveguide;

FIG. 2c is the same cross-sectional view as FIG. 2a, but shows a second alternative of an external tube crimped over the damping element; and FIG. 2d is the same cross-sectional view of FIG. 2a, but shows a third alternative of the return wire in a different position and with an external tube crimped over the damping element.

DETAILED DESCRIPTION OF THE PREFERRED EMBODIMENT

Figure 1:
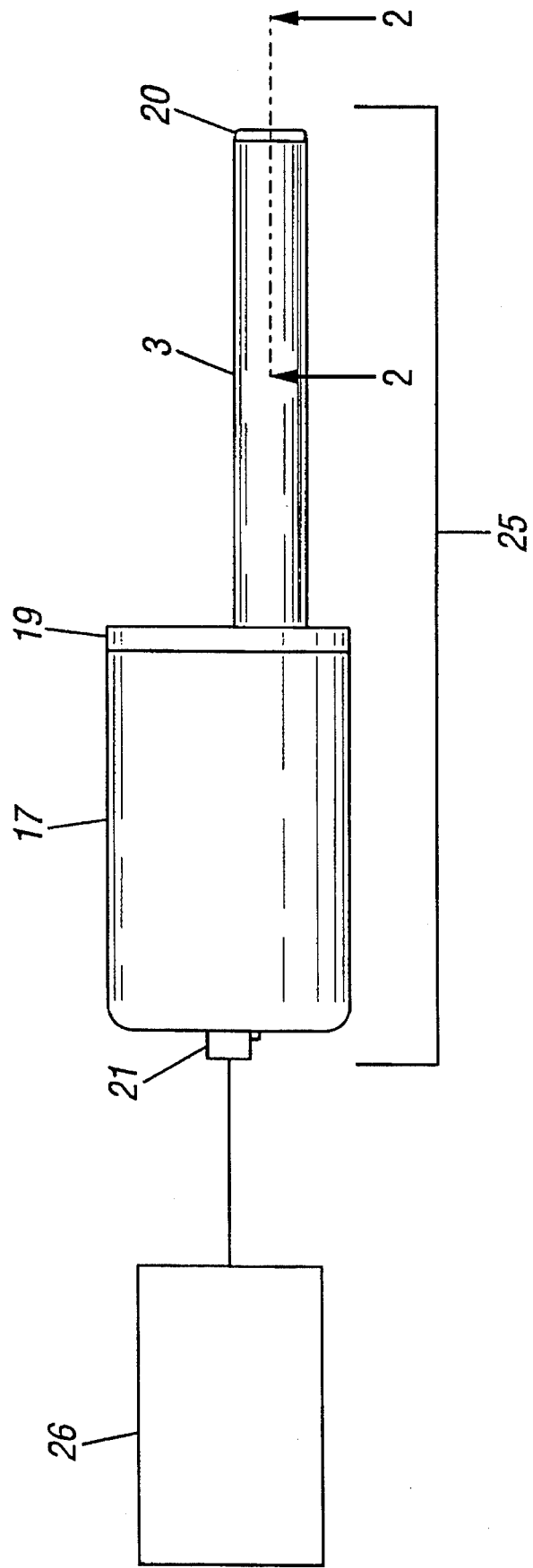
FIG. 1 depicts a side, elevated view of the complete sensing element assembly.

A transducer or sensing element assembly, which may be any transducer, including those of the prior art such as that shown in U.S. Pat. No. 3,898,555 or any other transducer presently on the market or may be introduced in the future, is shown indicated at 25 in FIG. 1. Transducer 25 may be used for measuring displacements and/or distances or other measurements, and the damping device of the present invention will be applicable to any of them. The general type of transducer should not be deemed as limiting the invention.

The transducer 25 includes an elongated waveguide assembly enclosed in an enclosure tube 3. Enclosure tube 3 and the waveguide assembly are mechanically supported at one end by a housing 17 through an end flange 19. The waveguide assembly includes the outer enclosure tube 3 surrounding a coaxial elongated interior waveguide 4 (FIG. 2). Whenever "FIG. 2" is referenced in this specification, it means any of the embodiments of FIGS. 2a–2d. A current is passed through the waveguide 4 and returns through a return wire 1 electrically connected to the waveguide 4. Typically, a magnet (not shown) is mounted over the waveguide assembly and enclosure tube 3 by being placed over and coaxial with enclosure tube 3. The magnet interacts with the current pulse as more completely described in U.S. Pat. No. 3,898,555. Upon the strain wave pulse returning to the housing 17 after passing through the waveguide 4 and return wire 1, the placement of waveguide 4 and return wire 1 being more completely described below, a suitable mode converter (not shown) provides an electrical signal through connector 21 to any electronic circuit connected to it, such as electronic circuit 26.

The structure of the connector 21 and circuit 26 is dependent on the use of transducer 25, and will work with the damping element of the present invention despite disparities in structure. The structure of electrical connector 21 and circuit 26 should not be considered as limiting the invention. Thus, no particular mechanism for the arrangement of the elements 17, 19, 21, 26 is shown to be preferred to emphasize generality. Further, it should be understood that the damping mechanism of the present invention is applicable to any transducer 25 and waveguide 4 of the type for measuring displacement and/or distance and/or other measurement using the magnetostrictive principles, such as generally shown in U.S. Pat. No. 3,898,555. Thus, for example, no particular mechanism for the arrangement of the elements in the housing 17 is shown to be preferred to emphasize generality. The mechanism may be any such as those shown in U.S. Pat. No. 3,898,555 or others known in the art or still to be thought of in the art or that are in design in the art. For this same reason, the type of magnet used and the type of application used is also not shown, and may be any application. Finally, because there is some need to show the interaction between the damping element 6 (FIG. 2) and the other portions of transducer 25 at the remote portion of the waveguide assembly, a preferred embodiment for a suspension sleeve 2 (FIG. 2), discussed below, is shown. This should not be considered as limiting but only illustrative, the damping element 6 being capable of use with any type of waveguide assembly as set out above.

The remote end portion of enclosure tube 3, remote from housing 17, is shown in cross-section in FIG. 2 and ends with an end plug 20. An inert gas may be introduced in enclosure tube 3 to further promote isolation and sealing. End plug 20 acts to stop fluid and other materials from entering enclosure tube 3. The end of the waveguide assembly, having end plug 20 is normally the end which would be at the bottom of a tank, if transducer 25 is being used for determining the level of liquid in a tank, or at the end of the displacement if the transducer 25 were used to measure distance. As discussed in the Background, it is desired to make the dead zone, or non-signal producing zone, adjacent to the end plug 20 as short as possible and yet accomplish the purpose of dampening the sonic strain wave signal to prevent reflected strain waves from interfering with the desired return strain wave signal that represents distance or level, such as discussed in U.S. Pat. No. 3,898,555.

As shown in FIG. 2, a waveguide 4 is enclosed through concentrically layered enclosure mechanisms, including a suspension sleeve 2 and enclosure tube 3. The suspension sleeve 2 comprises a tubular braided sleeve, or elastomer sleeve, or composite sleeve, of a geometry having the characteristics of restricting the lateral movement of the waveguide 4 and insulating the waveguide 4 from vibration and external sonic noise yet not contacting the waveguide 4 so much as to damp the sonic strain wave signal generated by the interaction of the electric current and external magnet. Suspension sleeve 2 is coaxial with and surrounds the waveguide 4 for substantially its entire length, or at least a major portion thereof. Suspension sleeve 2 is shown mounted within and coaxial for substantially the entire length of waveguide 4, or at least a major portion thereof, with outer enclosure tube 3.

The inner diameter of the suspension sleeve 2 must be small enough to limit the movement of the waveguide 4 yet large enough so that it does not hold, grab, constrict or otherwise compress the waveguide 4. If suspension sleeve 2 compresses, holds, grabs or constricts the waveguide 4, attenuation of the sonic strain wave signal along waveguide 4 will occur. The Wiedemann Effect does not promote a large sonic strain wave signal in the prior art, making it difficult to differentiate it from noise produced by other mechanisms. Accordingly, signal attenuation is known in the prior art to be a phenomenon to be avoided.

The outer diameter of suspension sleeve 2 must be large enough to restrict lateral movement of suspension sleeve 2 within enclosure tube 3, yet small enough to fit easily within the inner diameter of the enclosure tube 3, together with the return wire 1 as will be discussed below. Also, it may be possible to have the suspension sleeve 2 present without requiring the restriction of an enclosure tube 3, and the use of an enclosure tube 3 should not be considered limiting to the invention or even to the waveguide suspension. Overall, the waveguide 4 must be suspended in a manner that cushions it from shock and vibration stimuli so that associated erroneous responses are eliminated.

Suspension sleeve 2 includes an inner layer 27 and an outer layer 29. The fiber that makes up inner layer 27 of suspension sleeve 2 is non conducting and may be a fine, hard material, or a combination of materials such as ceramic or glass or metal or polymer. The strand count and weave configuration of such fiber are typically from eight to sixteen strands in diamond, regular, hercules or other weave patterns. Such strand, count and weave configuration enable the suspension sleeve 2 to act as a cushion between the waveguide 4 and the enclosure tube 3. Interior to the inner layer 27 and exterior to the waveguide 4, there is clearance 28 such that the inner layer 27 is loosely fitting around waveguide 4. The outer layer 29 of suspension sleeve 2 helps to maintain the shape of the inner layer 27, and isolate it from the enclosure tube 3. The outer layer 29 is typically a softer material, such as a silicone rubber and is a second layer of inner layer 27.

Suspension sleeve 2 ends at its remote side at end 31 facing toward the end plug 20. Juxtaposed with the end 31 of the suspension sleeve 2 is damping element 6. Damping element 6 is slipped over the end of the waveguide 4 and is coaxial with waveguide 4 and generally cylindrical in shape, as is suspension sleeve 2. However, the damping element 6 is not loose fitting over the waveguide 4, but is more constrictive over waveguide 4 in order to provide damping. Thus, as shown in FIGS. 2a and 2b, the inner layer 27 of damping element 6 snugly fits about waveguide 4. Further, the outer layer 29 of damping element 6 while usually of softer elastomer materials, such as silicone rubber, does not normally contact enclosure tube 3, as does outer layer 29 of suspension sleeve 2, but instead is sized to control the amount of and to exert pressure on the inner layer 27 which in turn exerts pressure on the waveguide 4. Thus, a space is left between the outer layer 29 of damping element 6 and the inner surface of enclosure tube 3.

In addition, a tuning wire 5 (see FIG. 2b) of a diameter ranging from 0.005 inches to 0.016 inches may be used to act as a wedge, thereby controlling the pressure of inner layer 27 on the waveguide 4. The tuning wire 5 is adjacent to waveguide 4 and extends substantially along and is enclosed by inner layer 27 of damping element 6. It is used to change the acoustic impedance of the damping element 6 but to do so gradually so that the sonic strain wave signal is dampened gradually along the distance of the waveguide 4 enclosed by damping element 6. In this way, no reflection will occur from sudden changes in impedance, but instead damping of the sonic strain wave amplitude along the damping element 6 will occur. It should be noted that the tuning wire 5 while only shown in FIG. 2b may be used with any of the configurations of FIGS. 2a–2d and may be used in any other kind of damping element for the purposes set out above.

Further, because damping element 6 is used to provide optimum damping of the sonic strain wave pulse traveling in the waveguide 4, and because proper acoustic matching of the waveguide 4 and the damping element 6 is determined by the pressure exerted on the waveguide 4 by the inner layer 27, there are other mechanisms besides the tuning wire 5 that can be used. As shown in FIGS. 2c and 2d, a damping element 6 for use over a broad temperature range could be used, comprising a short braided sleeve 8 of the sort of inner layer 27, but with such braided sleeve 8 inserted into a coaxial, larger diameter metal sleeve 9. This assembly of sleeves 8, 9 is slipped onto the end of the waveguide 4. The metal sleeve 9 may then be crimped such that the braided sleeve 8 contacts the waveguide 4 with sufficient pressure to provide the required damping action.

Thus, as seen through FIGS. 2a–2d, damping may occur through the pressure of outer layer 29 or through the tuning wire 5 trapped in inner layer 27 or through the crimping of metal sleeve 9 or by any other mechanism that applies the appropriate pressure to control the impedance matching along a predetermined length of the damping element 6 as determined by experiment.

The end 32 of damping element 6 facing end 31 of suspension sleeve 2 is cut between a 40° and 50° angle and preferably about a 45° angle in order to properly match its impedance to that of the waveguide 4.

An additional way to minimize end reflections from the damping element 6 is to place another damping sleeve 33 of dissimilar material or size or pressure in front of damping element 6 (toward the suspension sleeve 2). Damping sleeve 33 should be designed to have a closer acoustic impedance match to the waveguide 4. That is, it should have less pressure, or smaller outer diameter, or lower mass density than damping element 6, or if it is an elastomer, it should have a low durometer, such that the front end reflection is minimized. Damping sleeve 33 includes a face 34 facing toward face 32 of damping element 6. Face 34 normally has a plane substantially perpendicular to the longitudinal axis of the waveguide 4. It should be noted that damping sleeve 33 may be used with any of the damping elements 6 of FIGS. 2a, 2b, 2c and 2d, and the depiction showing it only in FIG. 2a should not limit its generality. Further, the orientation of face 34 will not change if damping sleeve 33 is used with the damping sleeves 6 of FIGS. 2b, 2c or 2d, each of which has a slanted face 32. The face 34 will continue to have a plane substantially perpendicular to the longitudinal axis of the waveguide 4. Generally, this damping sleeve 33 does not damp as efficiently as the damping element 6, but it will damp the reflection from the damping element 6, thereby lowering the overall sonic energy leaving the damping system, damping element 6 acting as the primary damp and damping sleeve 33 acting as a secondary damp.

Still another method of minimizing the front end reflection coming from the damping element 6 is to expand the inside diameter of the damping element 6 at the front end. The end facing suspension sleeve 2. This can be accomplished by inserting a flaring tool in such front end of the damping element 6 just prior to placing it on the waveguide 4.

Still another method for minimizing the front end reflection coming from damping element 6 is to remove material from the outside diameter on such from end of damping element 6. This removal region should be in the range of 0.125" to 0.5" as measured from such front end of damping element 6. This can be accomplished, for example, by using a set of wire strippers to remove pan of the elastomer that overlaps the braid.

The return wire 1 must pass over damping element 6 as shown in FIGS. 2a, 2b and 2d, or through damping element 6 as in FIG. 2c. In FIG. 2c, the return wire 1 is insulated (as it may be in all other cases) and can also act in a manner similar to the tuning wire 5 of FIG. 2b. In all events, the return wire 1 must then be attached to the tip of the waveguide 4 using solder or a crimp ring 7, and must be electrically connected to form the rest of the circuit to support the current pulse which begins in housing 17 and flows through waveguide 4 to return through return wire 1, which may be arranged as discussed in U.S. Pat. No. 3,898,555 or any other way known or to be known in the art.

The pressure applied by the inner layer 27 may be substantially uniform, but may also be nonuniform with less pressure on the side facing the housing 17 and more pressure on the side facing the end plug 20 to shorten the length of the damping element 6 for a given damping effectiveness while preventing reflection.

Because many varying and different embodiments may be made within the scope of the invention concept taught herein which may involve many modifications in the embodiments herein detailed in accordance with the descriptive requirements of the law, it is to be understood that the details herein are to be interpreted as illustrative and not in a limiting sense.

What is claimed as invention is:

1. A damping element for use with a waveguide having an end remote from electronics connected to the waveguide, comprising:

an inner, tubular sleeve coaxial with the waveguide and surrounding the waveguide;

pressure means including an outer tubular sleeve coaxial with and surrounding said inner tubular sleeve for causing said inner, tubular sleeve to apply pressure to the waveguide along the length of the inner tubular sleeve.

2. The damping element of claim 1, wherein said outer sleeve is crimped to set the pressure of said inner sleeve on the waveguide.

3. The damping element of claim 2, wherein said outer sleeve is comprised of metal.

4. The damping element of claim 1, wherein said outer sleeve is comprised of a shape retaining material, said material exerting force on said inner sleeve to exert pressure on the waveguide.

5. The damping element of claim 4, wherein said outer sleeve is comprised of elastomer.

6. The damping element of claim 1, wherein there is further included a tuning wire, said tuning wire being adjacent to and extending longitudinally along the waveguide;

said inner sleeve surrounding said tuning wire and said pressure means exerting pressure on said tuning wire through said inner sleeve.

7. The damping element of claim 1, wherein said inner sleeve is comprised of a fine, hard material.

8. The damping element of claim 7, wherein said fine, hard material is ceramic.

9. The damping element of claim 7, wherein said fine, hard material is glass.

10. The damping element of claim 7, wherein said fine, hard material is a metal.

11. The damping element of claim 7, wherein said fine, hard material is a plastic.

12. The damping element of claim 1, wherein said inner sleeve is stranded and the strand count is between eight and sixteen.

13. The damping element of claim 1, wherein said inner sleeve is stranded and the weave configuration is diamond, regular, or hercules.

14. The damping element of claim 1, wherein there is included first means for minimizing energy reflection of said inner sleeve.

15. The damping element of claim 14, wherein said first means includes a second sleeve, said second sleeve coaxial with the waveguide and surrounding the waveguide, said second sleeve being located between the electronics and said inner sleeve.

16. The damping element of claim 15, wherein said second sleeve and said inner sleeve have damping characteristics, said damping characteristics of said second sleeve being less effective than said damping characteristics of said inner sleeve.

17. The damping element of claim 15, wherein said second sleeve has a face facing toward said inner sleeve, said face forming a plane substantially perpendicular to the longitudinal axis of the waveguide.

18. A damping element for use with a waveguide having an end remote from electronics connected to the waveguide comprising:

an inner sleeve coaxial with the waveguide and surrounding the waveguide;

pressure means connected to said inner sleeve for causing said inner sleeve to apply pressure to the waveguide;

a wire, said wire being adjacent to and insulated from the waveguide, said wire and the waveguide being surrounded by said inner sleeve.

19. A damping element for use with a waveguide having an end remote from electronics connected to the waveguide comprising:

an inner sleeve coaxial with the waveguide and surrounding the waveguide;

pressure means connected to said inner sleeve for causing said inner sleeve to apply pressure to the waveguide;

wherein said inner sleeve includes a face, facing towards the electronics, said face being at an angle with respect to a plane perpendicular to the axis of the waveguide.

20. The damping element of claim 19, wherein said angle is between 40° and 50°.

21. A damping element for use with a waveguide having an end remote from electronics connected to the waveguide, comprising:

a primary sleeve coaxial with the waveguide and surrounding the waveguide having first damping characteristic to minimize reflection of said primary sleeve;

secondary means coaxial with the waveguide and surrounding the waveguide, having second damping characteristics to minimize reflection of said secondary means;

said secondary means located between said primary sleeve and the electronics;

said second damping characteristics being less effective than said first damping characteristics.

22. The damping element of claim 21, wherein said secondary means includes a second sleeve.

23. The damping element of claim 22, wherein said second sleeve has a face facing toward said primary sleeve, said face forming a plane substantially perpendicular to the longitudinal axis of the waveguide.

* * * * *